United States Patent [19]

Chapman et al.

[11] Patent Number: 5,789,958
[45] Date of Patent: Aug. 4, 1998

[54] APPARATUS FOR CONTROLLING TIMING OF SIGNAL PULSES

[75] Inventors: Douglas J. Chapman, Lake Oswego, Oreg.; Jeffrey D. Currin, Pleasanton, Calif.; Philip Theodore Kuglin, Tualatin, Oreg.

[73] Assignee: Credence Systems Corporation, Fremont, Calif.

[21] Appl. No.: 782,608

[22] Filed: Jan. 13, 1997

[51] Int. Cl.$^6$ .................................................. H03K 5/13
[52] U.S. Cl. ..................... 327/261; 327/234; 327/161; 327/153; 327/172; 327/156; 327/147; 327/291
[58] Field of Search ...................... 327/105, 234, 327/141, 149, 151, 153, 161, 261, 172, 164, 159, 150, 156, 147, 158, 291; 364/721

[56] References Cited

U.S. PATENT DOCUMENTS 5,568,075  10/1996  Curran et al. ................... 327/172

Primary Examiner—Terry Cunningham
Assistant Examiner—Dinh Le
Attorney, Agent, or Firm—Smith-Hill and Bedell

[57] ABSTRACT

A timing signal generator adjustably times successive pulses of an output timing signal. The generator receives input data before each output pulse and controls the timing of that output pulse in accordance with the input data. The generator includes a circuit providing a set of 2N phase signals frequency locked to a reference clock signal but evenly distributed in phase. First and second selectors each sample the data once during each cycle of the clock signal. The sampled data tells the first selector whether it is to produce a first output signal during the next clock signal cycle and, if so, which of the first N phase signals the first selector is to select for controlling timing of edges of the first output signal. The sampled data also tells the second selector whether it is to produce a second output signal during a next clock signal cycle and, if so, which of the second N phase signals the second selector is to select for controlling the second output signal. The first and second output signals are logically ORed to produce the timing signal. The timing of data sampling by each selector is separately adjusted so that the selector output signal changes state only when the selected phase signal changes state and not when the selector changes its selection in response to newly sampled input data.

12 Claims, 5 Drawing Sheets

APPARATUS FOR CONTROLLING TIMING OF SIGNAL PULSES

BACKGROUND OF THE INVENTION

1. Field of the Invention

The present invention relates in general to timing signal generators and in particular to a timing signal generator employing multiplexers to alternately select taps of a delay line to control output signal timing.

2. Description of Related Art

Timing signal generators produce output signal pulses at adjustable intervals. A typical timing signal generator includes a programmable counter to count pulses of reference clock and to produce an output signal pulse whenever the count reaches a predetermined limit. The timing of each successive output signal pulse can be changed by reprogramming the counter between pulses. A timing signal generator may also include a timing vernier to adjustably delay the counter output pulse so as to more finely control the timing of the output pulse. A typical timing vernier as shown in FIG. 10 employs a ramp generator 100, a digital-to-analog (D/A) converter 102 and a comparator 104. The D/A converter 102 receives input data indicating a desired delay and produces an output reference signal of magnitude proportional to the input data. The ramp generator 100 produces an output ramp signal which begins to increase linearly in response to each pulse of the clock signal pulse. The comparator 104 produces the vernier output pulse when the ramp signal magnitude reaches that of the reference signal. The comparator 104 output signal pulse resets ramp generator 100 so that it may respond to the next clock signal pulse. The timing of an output signal pulse following any particular clock signal pulse can be altered by altering the data input to the D/A converter before the clock signal pulse arrives.

The "recycle time" of a timing vernier is a measure of how close in time its output pulses can be. The recycle time is desirably low. However, the timing vernier of FIG. 10 must have sufficient time after the trailing edge of one output signal pulse and the leading edge of the next input signal pulse to reset the ramp generator, to acquire the timing data for a next output signal pulse, and to alter its D/A converter output in response to the input timing data. To reduce recycle time, a prior art timing signal generator may use two timing verniers 110 and 112 as seen in FIG. 11. Vernier 110 can produce an output signal pulse during each even numbered cycle of a clock signal and vernier 112 can produce an output signal pulse during each odd numbered cycle of the clock signal. Counters 116 and 118 alternate input pulses to the two verniers. OR gate 114 combines the two timing vernier output signals to produce a single output signal. While one timing vernier is responding to the last input signal pulse the other timing vernier acquires new input data and prepares to respond to the next input signal pulse. Thus, for example, while each timing vernier can only produce output pulses that are at least 10 nanoseconds apart, the two timing verniers produce alternate pulses of a combined output signal that can be as close as 5 nanoseconds apart. The dual vernier system reduces the recycle time but requires the use of two verniers and two counters. Also the timing verniers are difficult to calibrate and are subject to errors due to non-linearity in the ramp generator output signal and process or temperature variations.

SUMMARY OF THE INVENTION

A timing signal generator in accordance with the present invention adjustably times successive pulses of an output timing signal. The generator receives input data before each output pulse and controls the timing of that output pulse in accordance with the input data. The generator includes a circuit providing a set of 2N phase signals frequency locked to a reference clock signal but evenly distributed in phase. The generator also includes first and second selectors each sampling the data once during each cycle of the clock signal. The sampled data indicates whether the first or second selector is to pulse its output signal during the next clock signal cycle and indicates which of the phase signals the selector should use to control timing of edges of the pulse. The first and second selectors' output signals are logically ORed to produce the timing signal. The timing of data sampling by each selector is separately adjusted so that the selector output signal changes state only when the indicated phase signal changes state.

The timing signal generator of the present invention provides accurately timed output signal pulses without requiring extensive space in an integrated circuit. The timing of individual output signals pulses can be changed on the fly with low recycle time. Process and temperature variations have minimal effect on the accuracy of the timing signal pulses.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(s)

DESCRIPTION OF THE PREFERRED EMBODIMENT

Figure 1:
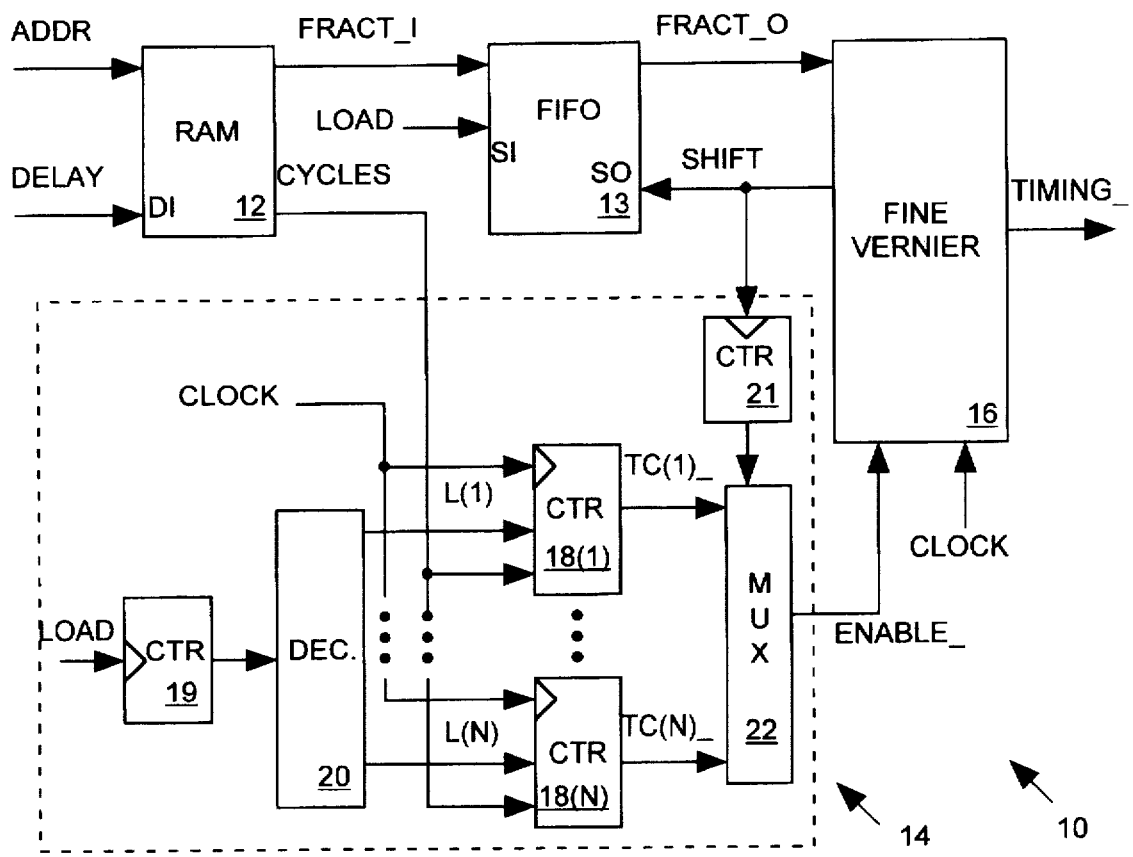
FIG. 1 illustrates in block diagram form a timing signal generator in accordance with the present invention.

FIG. 1 illustrates a timing signal generator 10 in accordance with the present invention. Generator 10 responds to an input START signal by producing a sequence of precisely timed output TIMING_ signal pulses using an input periodic CLOCK signal as a timing reference. (Herein signal names ending with an underscore "_" indicate low true signals. Leading edges of pulses of low true signals are negative-going. Signal names not ending with an underscore indicate high true signals having positive going leading edges.)

Generator 10 has four functional blocks as illustrated in FIG. 1, a random access memory (RAM) 12, a first-in, first-out (FIFO) buffer 13, a bank of programmable counters 14, and a fine vernier circuit 16. An external controller (not shown) stores a number of DELAY values at various addresses in RAM 12 and then supplies a series of ADDR inputs to RAM 12 causing RAM 12 to read out a potentially long sequence of DELAY data values. Each DELAY value stored in RAM 12 has two parts: a CYCLES value and a FRACT_I value. The CYCLES value is a pre-determined count limit indicating a number of CLOCK signal cycles to be counted before generating a TIMING_ signal pulse. The FRACT_I value indicates an additional "vernier delay" (0 to 15 sixteenths of a CLOCK signal) used to more finely adjust the TIMING_ signal pulse.

Timing operations are organized relative to a set of successive "major periods", each major period beginning with a pulse of a LOAD signal and lasting one or more integer number of CLOCK signal cycles as determined by the external controller. In particular, generator 10 provides one TIMING_ signal pulse in delayed response to the start of each major period as marked by the LOAD signal. The delay for each TIMING_ signal, as specified by the external controller, may range from a small fraction of a CLOCK signal cycle to several major periods in duration. Thus although generator 10 produces only one TIMING_ signal pulse in response to each LOAD signal, that TIMING_ signal pulse may be delayed briefly so as to occur during the next following major period or may be delayed longer so that it occurs during some successive major period.

Figure 2:
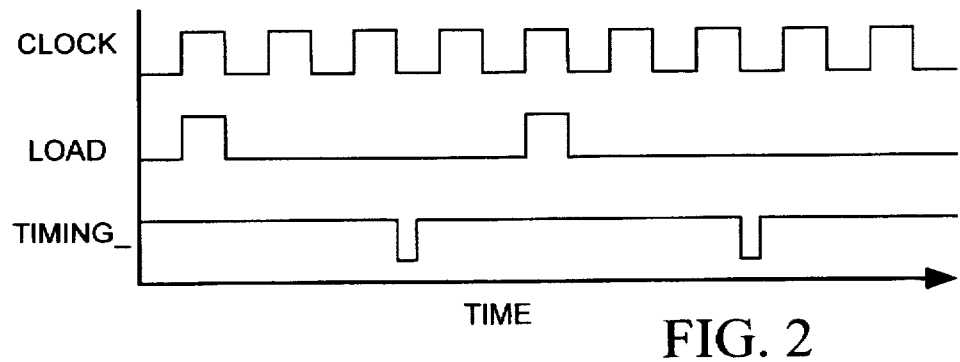
FIGS. 2 and 3 are timing diagrams illustrating relationships between signals appearing in the timing signal generator of FIG. 1.

FIG. 2 illustrates timing relationships between the CLOCK, LOAD and TIMING_ signals given a major period of four CLOCK periods. In this example two successive TIMING_ signal pulse outputs are each programmed with a CYCLES value of 2 and a FRACT_I value of 8. Thus in this case, each TIMING_ signal pulse follows its major period marker signal (LOAD) pulse by 2 and 8/16 CLOCK periods.

Figure 3:
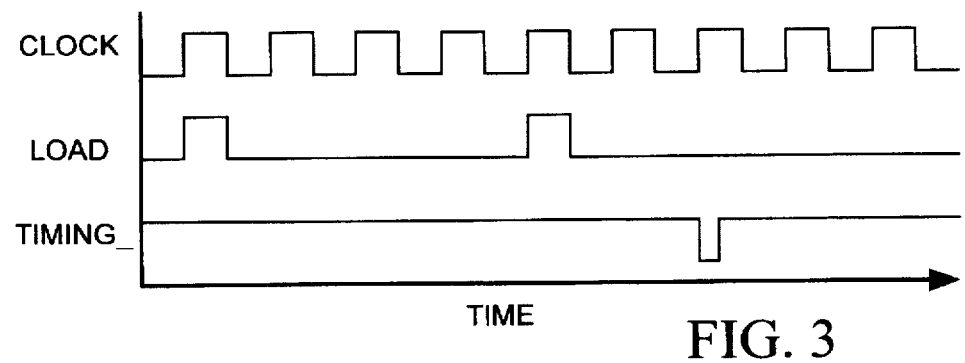

FIG. 3 illustrates the major period timing relationships between the CLOCK, LOAD and TIMING_ signals given a major period of four CLOCK periods with a TIMING_ signal output pulse programmed for a CYCLES value of 6 and a FRACT_I value of 0. In this case, a TIMING_ signal pulse is delayed from the major period marker (LOAD) by 6 and 0/16 CLOCK periods. Thus the TIMING_ signal pulse occurs during the next major period. This is a condition referred to as "cycle crossing."

Before the start of each major period, the external controller provides an address ADDR input to RAM 12. At the start of a major period, when RAM 12 has had adequate time to read out the DELAY value stored at the indicated address, the external controller pulses the LOAD signal supplied to the FIFO buffer 13 shift-in (SI) input. The LOAD signal tells FIFO buffer 13 to store the FRACT_I component of the read out DELAY value. The LOAD signal is also supplied to counter bank 14 and causes one of a set of N counters 18(1)–18(N) therein to store the CYCLES component of the read out DELAY value. In this manner the external controller shifts a new FRACT_I value into FIFO buffer 13 and loads a CYCLES value into one of counters 18 at the start of every major period. Since a number of CYCLES and FRACT_I values may be shifted into FIFO buffer 13 and loaded into counter bank 14 before a first TIMING_ signal pulse is actually created, the ability of generator 10 to "cycle cross" depends on the depth of FIFO buffer 13 and the number N of counters 18 in counter bank 14.

The FRACT_I value stored longest in FIFO buffer 13 will appear at its output terminals as FRACT_O. A SHIFT signal pulse supplied to the shift-out terminal of FIFO buffer 13 removes the longest stored FRACT_I data from FIFO buffer 13 so that the next—longest stored FRACT_I data appears at its output terminals as FRACT_O. FIFO buffer 13 supplies its FRACT_O data output to fine vernier 16. Counter bank 14 includes the set of N counters 18(1)–18(N), and a set of control logic devices 19–22. The first LOAD signal sent to counter bank 14 at the beginning of a first major period loads the first counter 18(1) with the first incoming CYCLES data. Counter 18(1) then begins to count downward from the CYCLES data value with each successive CLOCK signal. When counter 18(1) counts down to a zero value it pulses a terminal count signal TC(1)_ and then holds its count at zero until it is reloaded with new CYCLES data. At the beginning of the second major period, another LOAD signal will be sent to counter bank 14 causing the second counter 18(2) to load the next incoming CYCLES value and to begin to count CLOCK signal pulses. At the time counter 18(2) is loaded, first counter 18(1) may or may not have reached its terminal count depending on the number of major periods it must cross. Nonetheless, the counter 18(2) begins counting CLOCK cycles as soon as it is loaded, counting down from its initial CYCLES value until its count reaches zero. At that point the second counter will pulse at its output a terminal count signal TC(2)_ and then hold its count at zero until it is loaded again. All remaining counters 18(3)–18(N) operate a similar manner, each receiving in turn a CYCLES value input, counting down to zero and then generating its output terminal count signal pulse TC(3)_ –TC(N)_. When each successive counter 18(1)–18(N) has received a CYCLES value input, the next LOAD signal will cause the first counter 18(1) to reload the next incoming CYCLES value, thereby beginning the process of loading successive CYCLES values into counters 18(1)–18(N) once again.

The LOAD signal is supplied to a clock input of a counter 19. Counter 19 counts up pulses of the LOAD signal to generate output data decoded by a decoder 20. As the count output of counter 19 increases, decoder asserts N output signals L(1)–L(N) in succession, thereby successively input enabling corresponding counters 18(1)–18(N). On the first LOAD signal pulse after the count of counter 19 reaches N, it resets the count to 1.

A SHIFT signal supplied by fine vernier 16 drives a clock input of another counter 21. Counter 21 counts up pulses of the SHIFT signal. The count output of counter 21 controls a multiplexer 22 which selects one of the terminal count signals TC(1)_–TC(N)_ as an ENABLE_ signal output of counter bank 14. Prior to system operation, the external controller supplies a reset signal (not shown) to all counters 14, 19, and 20 to initialize their counts.

Counter bank 14 transmits the ENABLE_ signal pulse to the fine vernier 16 each time a counter 18(1)–16(N) within bank 14 generates a terminal count signal TC(x)_. The negative-going ENABLE_ pulse tells fine vernier 16 to produce a TIMING_ signal pulse during the current CLOCK signal cycle. Multiplexer 22 initially selects the terminal count output TC(1)_ from the first counter 18(1) to drive the ENABLE_ signal. When counter 18(1) has loaded a CYCLES value and counted down the number of CLOCK signal pulses indicated by the CYCLES value to reach zero, counter 18(1) will assert its TC(1)__ output signal. Since multiplexer 22 is currently selecting TC(1), the ENABLE__ signal is also asserted. Thereafter, wnen fine vernier 16 pulses the SHIFT signal, counter 21 switches multiplexer 22 so that it selects the TC(2)__ output of counter 18(2). When counter 18(2) reaches its terminal count, it asserts TC(2)__ thereby causing multiplexer 22 to assert the ENABLE__ signal.

Thus on each successive LOAD signal pulse data is loaded into a successive one of counters 18(1)–18(N), and on each successive SHIFT signal pulse multiplexer 22 selects a successive one of the TC(1)__–TC(N)__ output signals of counters 18(1)–18(N) for controlling the ENABLE__ signal. The counter bank 14 produces one ENABLE__ signal output pulse in response to each CYCLES data value that it receives in response to each LOAD signal pulse. But note that while the LOAD signal is periodic with a pulse occurring once each major period, the SHIFT signal pulses may arrive at irregular intervals which may be longer or shorter than a major period. With N counters 18(1)–18(N), counter bank 14 can receive up to N CYCLES data values between two SHIFT signal pulses.

Fine vernier 16 also receives the CLOCK signal and the current FRACT_O data output of FIFO buffer 13. Fine vernier 16 divides each CLOCK signal period into 16 time slots and can initiate an output TIMING__ signal pulse at the start of any one of those time slots. The FRACT_O data is a 4-bit value telling fine vernier 16 which time slot to use when generating the next TIMING__ signal output pulse. When counter bank 14 first asserts the ENABLE__ signal in response to the TC(1)__ output of counter 18(1), fine vernier 16 stores the current FRACT_O data output of FIFO buffer 13, waits until the time slot during the next clock cycle indicated by the FRACT_O data and thereupon produces an output TIMING__ signal pulse.

In the meantime, after receiving the ENABLE__ signal pulse from counter bank 14 and acquiring the current FRACT_O data output of FIFO buffer 13, fine vernier 16 transmits the SHIFT signal pulse to FIFO buffer 13 telling it to shift out the FRACT_O data for the next TIMING__ signal pulse. As discussed above, the SHIFT signal pulse also tells counter bank 14 to shift its ENABLE__ output from being driven by the terminal count signal output TC(1)__ of counter 18(1) to being driven by the terminal count signal output TC(2)__ of counter 18(2). When counter 18(2) subsequently asserts TC(2) having counted down to zero, multiplexer 22 transmits another ENABLE__ output pulse to fine vernier 16. Fine vernier 16, having previously shifted the FRACT_O data for the second TIMING__ signal pulse out of FIFO buffer 18, will acquire that FRACT_O data and thereafter produce the second TIMING__ signal pulse at the time during the current CLOCK cycle indicated by that FRACT_O data. After acquiring the second FRACT_O data output of FIFO buffer 13, fine vernier 16 pulses the SHIFT signal again causing FIFO buffer 13 to shift out the FRACT_O data for the third TIMING__ signal pulse and causing counter bank 14 to turn over control of the ENABLE__ signal to its third counter 18(3). This process continues in a similar fashion for as long as the external controller supplies addresses to RAM 12 and LOAD signal pulses to counter bank 14.

Thus generator 10 can produce a TIMING__ signal output with individual delays between successive pulses being set on-the-fly by successively addressing various DELAY values programmed into RAM 12. Accordingly, fine vernier 16 must acquire FRACT_O data on-the-fly between TIMING__ signal pulses. To minimize recycle time (the minimum time between successive TIMING__ signal pulses), vernier 16 must be able to produce a next TIMING__ signal pulse starting in a time slot following desirably close to the trailing edge of the previous TIMING signal pulse. Thus while vernier 16 is waiting to produce one TIMING signal pulse it acquires and processes new FRACT_O data for a next TIMING__ signal pulse so that it can, if necessary, produce the next TIMING__ signal pulse shortly after the trailing edge of the current TIMING__ signal pulse.

Figure 4:
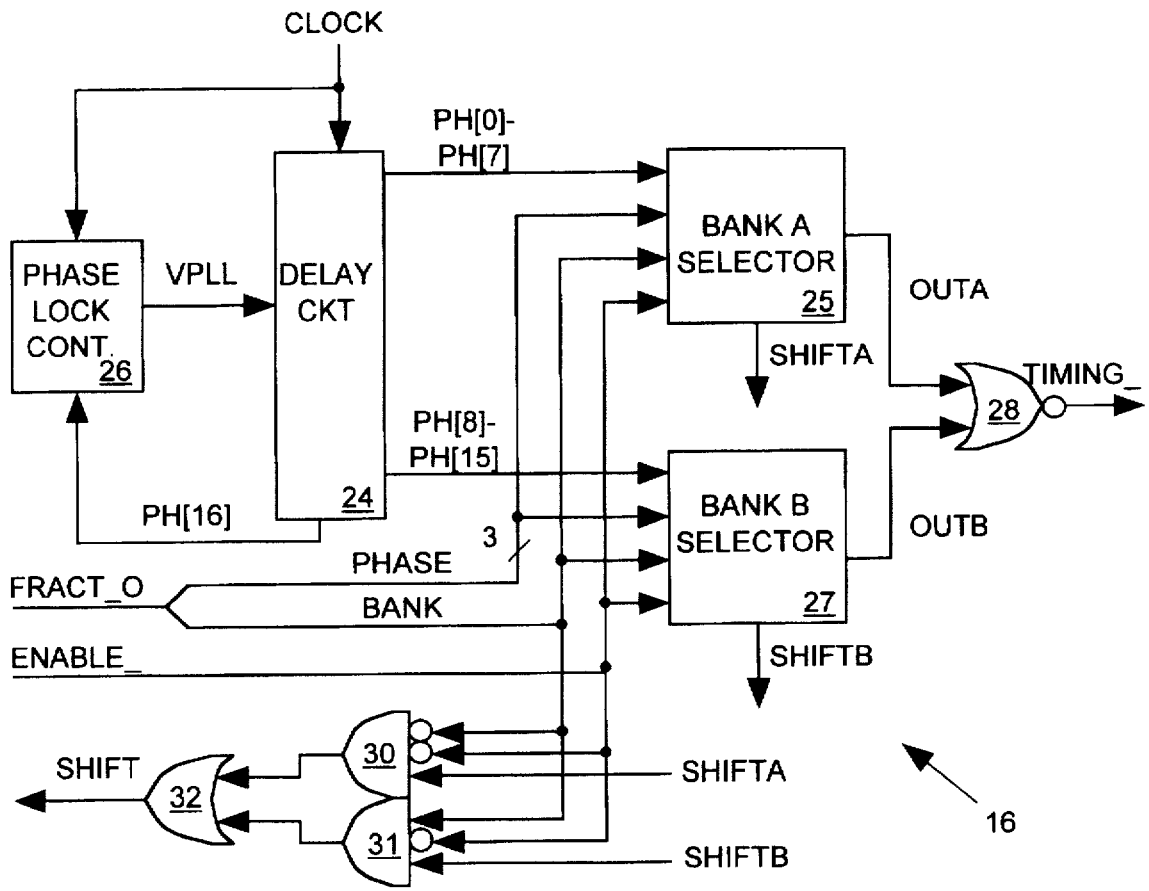
FIG. 4 illustrates in block diagram form the fine vernier circuit of FIG. 1.

FIG. 4 illustrates fine vernier 16 of FIG. 1 in more detailed block diagram form. Fine vernier 16 includes a delay circuit 24 receiving the CLOCK signal and producing in response a set of 17 periodic "phase" signals PH[0] through PH[16] having the same frequency as the CLOCK signal but evenly distributed in phase with respect to the CLOCK signal. The CLOCK signal and the most delayed phase signal PH[16] are supplied as inputs to a phase lock controller 26. Controller 26 supplies a control signal VPLL to delay circuit 12 for adjusting the delay of circuit 24 so that its PH[0] and PH[16] signals are phase locked to the CLOCK signal.

Figure 6:
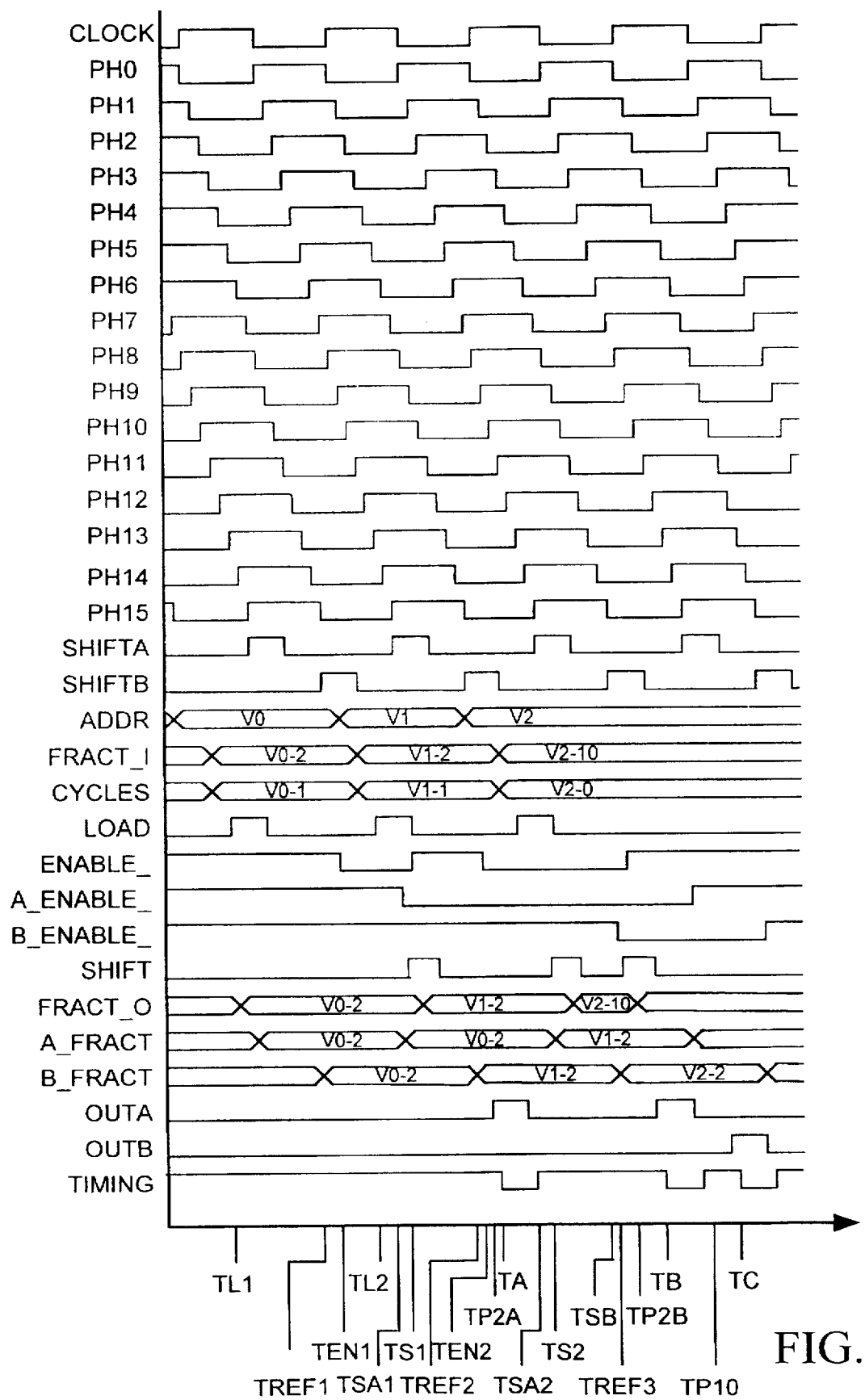
FIG. 6 is a timing diagram illustrating relationships between signals appearing in the circuits of FIGS. 1 and 4.

FIG. 6 illustrates the phase relationships between the CLOCK signal and the seventeen phase signals PH[0] through PH[16]. With PH[0] and PH[16] phase locked to the CLOCK, each phase signal PH[K] (for K=1 through 16) is delayed from CLOCK by K/16ths of the period of the CLOCK signal. Thus trailing edges of the PH[0] through PH[15] tap signals divide the period of the CLOCK signal into 16 equally spaced time slots.

Referring again to FIG. 4, fine vernier 16 also includes a "bank A" selector 25 and a "bank B" selector 27. The bank A selector 25 receives the FRACT_O data, the ENABLE__ signal and a first bank of eight phase signals PH[0]–PH[7] and produces an output signal OUTA. The bank B selector 27 receives as input the FRACT_O data, the ENABLE__ signal and the second bank of eight phase signals PH[8]–PH[15] and produces an output signal OUTB. A NOR gate 28 combines the OUTA and OUTB signals to produce the TIMING__ signal.

When asserted (pulled low) the ENABLE__ signal indicates that a TIMING__ signal pulse is to be generated during the current CLOCK signal cycle. The 4-bit FRACT_O data includes a single BANK select data bit and 3-bit PHASE select data. The BANK select bit indicates which bank selector 25 or 27 is to control the timing of the next TIMING__ signal pulse. The three PHASE select bits indicate which of its eight input phase signals the indicated bank selector 25 or 27 is to use when controlling the timing of the next TIMING__ signal pulse.

Bank selectors 25 and 27 normally hold the output signals OUTA and OUTB low, thereby keeping the TIMING__ signal output of NOR gate 28 high. However when the ENABLE__ signal is asserted the particular bank selector 25 or 27 identified by the BANK bit drives its output signal (OUTA or OUTB) high the next time the particular one of phase signals PH[0]–PH[15] (identified by the PHASE data) goes low. The OUTA and OUTB bank output signals will stay asserted for a brief period suitably equal to one fifth of a CLOCK signal cycle. As an OUTA or OUTB pulse goes high, it causes NOR gate 28 to drive the TIMING__ signal low. One fifth of the CLOCK cycle signal later, as the OUTA or OUTB pulse goes low again, NOR gate 28 drives the TIMING__ signal high. Thus the TIMING__ signal pulse has a duration of one fifth of a CLOCK signal cycle. Bank selectors 25 and 27 each sample and then respond to the input ENABLE__, BANK, and PHASE signals once during each cycle of the CLOCK signal. When bank A selector 25 samples its input data, it produces an output signal SHIFTA. Similarly, when bank B selector 27 samples its input data, it produces an output signal SHIFTB. The SHIFTA and SHIFTB signals and the BANK and ENABLE_ signals provide input to a set of logic gates 30-32. The BANK select bit and the enable signal ENABLE_ drive inverting inputs of AND gate 30 and the SHIFTA signal drives a non-inverting input of AND gate 30. The ENABLE_ signal drives an inverting input of AND gate 31 and the SHIFTB and BANK select bits drive non-inverting inputs of AND gate 31. The outputs of AND gates 30 and 31 drive inputs of OR gate 32. OR gate 32 produces the SHIFT signal.

Gates 30-32 pulse the SHIFT signal supplied to FIFO buffer 13 of FIG. 1 when FIFO buffer 13 is to deliver new FRACT_O data to fine vernier 16 and when the control of the ENABLE_ output from counter bank 14 is to shift to the next counter's terminal count output. Table I below indicates the state of the SHIFT signal in response to combinations of states of ENABLE_, SHIFTA, SHIFTB, and BANK select bits. In Table I, a "1" is true, a "0" is false, and an "X" is either true or false.

TABLE I

| ENABLE_ | SHIFTA_ | SHIFTB_ | BANK | SHIFT |
|---------|---------|---------|------|-------|
| 0 | X | X | X | 0 |
| 1 | X | 1 | 1 | 1 |
| 1 | 1 | X | 0 | 1 |

The FRACT_O data output of FIFO buffer 13 of FIG. 1 defining the phase of the next TIMING_ signal pulse with respect to the current CLOCK signal cycle, remains unchanged until counter bank 14 asserts the ENABLE_ signal. Counter bank 14 asserts the ENABLE_ signal at the start of a CLOCK signals cycle to indicate that fine vernier 16 is to produce a TIMING_ signal pulse during the current CLOCK signal cycle. If the BANK bit identifies bank A, then after counter bank 14 of FIG. 1 asserts the ENABLE_ signal, and after the bank A selector 25 has sampled and stored the current FRACT_O data as indicated by its SHIFTA output signal, gates 30-32 will pulse the SHIFT signal. If the BANK bit identifies bank B, then after bank selector 27 has sampled and stored the current FRACT_O data as indicated by its SHIFTB output signal, then gates 30-32 will pulse the SHIFT signal. The SHIFT signal tells FIFO buffer 13 of FIG. 1 to shift out its next stored FRACT_O data. The SHIFT signal also tells counter bank 14 to shift the control of its ENABLE_ output to the next sequential counter's terminal count output. If the next sequential counter in counter bank 14 has been loaded with CYCLES data greater than 0 and is still in the process of counting down CLOCK pulses, the ENABLE_ signal will remain high until that counter terminal counts. If that counter has been loaded with a CYCLES value equal to 0, or has already counted down to 0, the ENABLE_ signal will immediately be re-asserted.

When the BANK data references bank A selector 25, the PHASE data tells selector 25 to select one of the PH[0]-PH[7] signals to control the timing of its next OUTA signal pulse. Selector 25 samples the PHASE data a sufficient time before the PH[0] transition so that it is ready to pulse the OUTA signal in response to the PH[0] signal if the PHASE data selects the PH[0] signal. Selector 25 is an edge-sensitive multiplexer: the selected phase input has to be high for a short time and then transition low in order to cause a low to high transition on OUTA.

When the BANK data references bank B selector 27, the PHASE data tells selector 27 to select one of the PH[8]-PH[15] signals to control the timing of its next OUTB signal pulse. Selector 27 samples the PHASE data a sufficient time before the PH[8] transition so that it is ready to pulse the OUTB signal in response to the PH[8] signal if the PHASE data selects the PH[8] signal. Selector 27 is an edge-sensitive multiplexer: the selected phase input has to be high for a short time and then transition low in order to cause a low to high transition on OUTB.

Selectors 25 and 27 alternatively sample and respond to their input data at times that are 180 degrees apart with respect to the CLOCK signal period. Thus, while the bank A selector 25 may be busy controlling the output TIMING_ signal based on its last sampled value of the PHASE and BANK data, the bank B selector 27 is free to sample and store new input data for the next TIMING_ signal pulse and to prepare itself, if necessary, to produce that next pulse immediately after the pulse produced by the bank A selector. This alternating control of two bank selectors over the TIMING_ signal helps to minimize the recycle time because the time each selector requires to obtain new timing data for each pulse does not affect recycle time.

Figure 5:
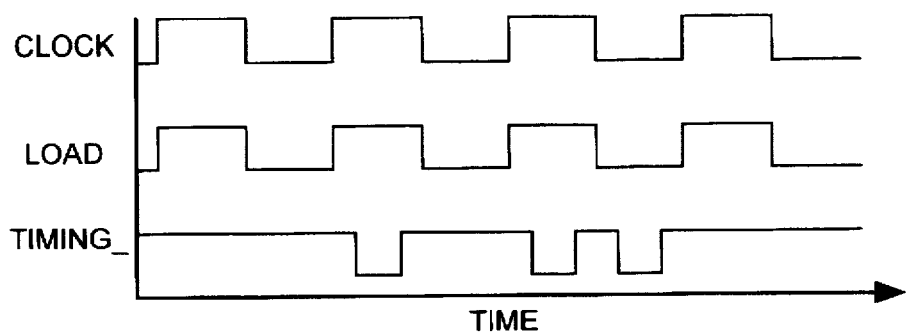
FIG. 5 is a timing diagram illustrating relationships between signals appearing in the timing signal generator of FIG. 1.

FIG. 5 illustrates relationships between the CLOCK, LOAD and TIMING_ signals and shows timing signal generator 10 operating with a major period of one CLOCK period and producing a TIMING_ signal output with three pulses. The first two TIMING_ signal pulses each have CYCLES values of one and FRACT_O values of two. This means the first TIMING_ pulse will occur at a time one (CYCLES=1) and two sixteenths (FRACT_O=2) of a CLOCK signal period after the beginning of the first major period. This first TIMING_ signal pulse will be a "cycle crossing" pulse. The second TIMING_ signal pulse uses the same programmed values (CYCLES=1,FRACT_O=2), and will occur at one and two sixteens of a CLOCK signal period after the beginning of the second major period. The third TIMING_ signal pulse will have programmed timing that changes "on-the-fly": it will have a CYCLES value of zero and a FRACT_O value of ten. The third TIMING_ signal should occur zero and ten sixteenths of a CLOCK signal period after the beginning of the third major period. Note that the first two TIMING_ signal pulses have a time interval between them equal to one CLOCK signal period. Yet, the time interval between the second and third TIMING_ signal pulses is equal to one half a CLOCK signal period.

FIG. 6 illustrates relationships between the signals appearing in FIG. 4 in an example of signal generator operation in which the TIMING_ signal is to include three (negative-going) pulses at starting times TA, TB, and TC programmed using the timing relationships shown in FIG. 5. The TIMING_ signal pulse starting at time TA was produced by an OUTA pulse output of selector 25 starting at time TP2A on the falling edge of the PH[2] signal. At a time TSA1, bank A selector 25 sampled the input FRACT_O and ENABLE_ data for that first TIMING_ signal pulse. The input ENABLE_ signal transitioned from high to low at time TEN1 when the TC output of the first counter of bank 14 (FIG. 1) became active after the first counter had counted the number of CLOCK signal pulses down to zero.

The first counter was loaded with a CYCLES value of one in this example at a time TL1. The acquired ENABLE_ data (a signal A_ENABLE_ within selector 25) indicated that an output TIMING_ signal pulse was to be produced by one of the falling PH[0]-PH[7] signals during the current clock cycle. The input FRACT_O data transitioned to its first data value of two at time TL1 also. The acquired FRACT_O data (A_FRACT of FIG. 1) told bank A selector 25 to select the PH[2] signal for controlling OUTA. Since OUTA was low and PH[2] had not yet transitioned between high and low, OUTA did not immediately change state. However, at time TP2A the selected phase signal PH[2] went low causing OUTA to go high. After the OUTA signal went high, the TIMING_ signal output of gate 28 went low at time TA. A short time after time TA, the OUTA signal transitioned back to low state due to the operation of a pulse generator within bank A selector 25.

At time TSA1 after bank A selector 25 acquired the input FRACT_O data, selector 25 generated a SHIFTA signal pulse causing gates 30–32 to produce a SHIFT signal pulse. The SHIFT pulse caused FIFO buffer 13 to shift out new FRACT_O data. The SHIFT pulse also caused counter bank 14 to shift control of the ENABLE_ output from the first counter's TC output to the second counter's TC output, thereby causing the ENABLE_ signal to transition from its low state back to its high state. The second counter's TC output was previously loaded with the second CYCLES value from the external controller at a time TL2. In this example, the second CYCLES value is one. The second counter of counter bank 14 reached its terminal count at time TEN2, causing the ENABLE_ output to transition from high to low at time TEN2. At time TSA2, in response to the falling edge of the PH[6] signal, bank A selector 25 sampled the FRACT_O and ENABLE_ data. This FRACT_O data was the second data value loaded into FIFO buffer 13. The FRACT_O output from FIFO buffer 13 switched from its first loaded data value to its second loaded data value shortly after time TS1. The acquired ENABLE_ data (the signal A_ENABLE_ within the selector) told selector 25 that another TIMING_ signal pulse was to be produced by one of the falling PH[0]–PH[7] signals during the current clock cycle. The acquired FRACT_O data (A_FRACT in FIG. 6) told selector 25 that the TIMING_ signal pulse was to be controlled by the PH[2] signal again. Also at time TSA2, when bank A selector sampled the current FRACT_O and ENABLE_ data, it also pulsed the SHIFTA signal, causing gates 30–32 to pulse the SHIFT signal. This second pulse of the SHIFT signal occurs at time TS2. This SHIFT signal told FIFO buffer 13 of FIG. 1 to shift out new FRACT_O data. Note that in FIG. 6 the FRACT_O data transitions from the second to the third value between times TS2 and TREF3. The SHIFT pulse occurring at time TS2 also caused counter bank 14 to shift control of the ENABLE_ output from the second counter's TC output to the third counter's TC output. The third CYCLES value in this example was zero. Thus, at time TS2 the third counter within counter bank 14 had already had its TC output become active, and the ENABLE_ signal from counter bank 14 therefore continued to remain low. At time TP2B (after the second active ENABLE_ signal was sampled by selector 25 time TSA2), the selected phase signal PH[2] transitioned low causing OUTA to go high for the second time. After the OUTA signal went high, the TIMING_ signal output of gate 28 went low at time TB. A short time after time TB, the OUTA signal transitioned back to low state due to the operation of the pulse generator within bank A selector 25. Note the time interval between the beginning of the first TIMING_ signal pulse at time TA and the beginning of the second TIMING_ signal pulse at a time TB. There is a difference of exactly one clock cycle between times TA and TB. Since the LOAD signal pulses once per CLOCK signal cycle, the major period in this example is equal to the period of the CLOCK signal. The CYCLES value for both the first and second TIMING_ signal pulses was one. The FRACT_O data for the first and second TIMING_ signal pulses were both two.

The CYCLES value of one for the first two TIMING_ pulses being one, combined with the FRACT_O data for the first two TIMING_ signal pulses being two, indicated that TA should occur at a time one clock cycle (CYCLES equals one) and two sixteenths (FRACT_O equals two) of a clock cycle after time TREF1. Time TREF1 marks the beginning of the first major period. Time TB also was setup in this example to occur at a time one and two sixteenths of a clock cycle after the beginning of the second major period which occurred at time TREF2. At time TSB, in response to the falling edge of the PH[14] signal, bank B selector 27 sampled the FRACT_O and ENABLE_ data. This FRACT_O data was the third value loaded into FIFO buffer 13. the FRACT_O output from FIFO buffer 13 switched from the second value loaded to the third value shortly after time TS2. The acquired ENABLE_ data (the signal B_ENABLE_ within the selector) told selector 27 that another TIMING_ signal pulse was to be produced by one of the falling PH[8]–PH[15] signals during the current clock cycle. The acquired FRACT_O data (B_FRACT in FIG. 6) told selector 27 that the TIMING_ signal pulse was to be controlled by the PH[10] signal again. Also at time TSB, when bank B selector sampled the current FRACT_O and ENABLE_ data, it also pulsed the SHIFTB signal, causing gates 30–32 to pulse the SHIFT signal. This third pulse of the SHIFT signal caused the FRACT_O data output from FIFO buffer 13 to be updated to a fourth value. The SHIFT pulse also caused a transition within counter bank 14, such that control of the ENABLE_ output changed from the third counter's TC output to the next counter's TC output. That next counter may be a fourth counter within the bank, or it could cycle back to the first counter depending upon the number of counters in bank 14 (FIG. 1). In this example, the fourth counter was loaded with a CYCLES value of one or greater, so the ENABLE_ signal will transition from low to high after the third SHIFT pulse, and will remain high until that counter has counted down the appropriate number of CLOCK signal cycles down to zero and terminal counts.

At a time TP10 after time TSB when the third active ENABLE_ signal was sampled by selector 27, the selected phase signal PH[10] transitioned low causing OUTB to go high for the first time. After the OUTB signal went high, the TIMING_ signal output of gate 28 went low at time TC. A short time thereafter, the OUTB signal transitioned back to its low state due to the operation of the pulse generator within bank B selector 27. Note the time interval between the beginning of the second TIMING_ signal pulse at time TB and the beginning of the third TIMING_ signal pulse at a time TC. There is a difference of exactly one half of one clock cycle between them. In the example of FIGS. 5 and 6, three successive TIMING_ signal pulses were produced with leading edges separated by adjustable delays. The fine vernier circuit 16 of FIG. 1 can produce TIMING_ signals pulses having leading edges as frequently as once every one half of one cycle of the CLOCK signal and can adjust the timing of the TIMING_ signal pulse with a resolution of one sixteenth of a CLOCK cycle period.

Figure 7:
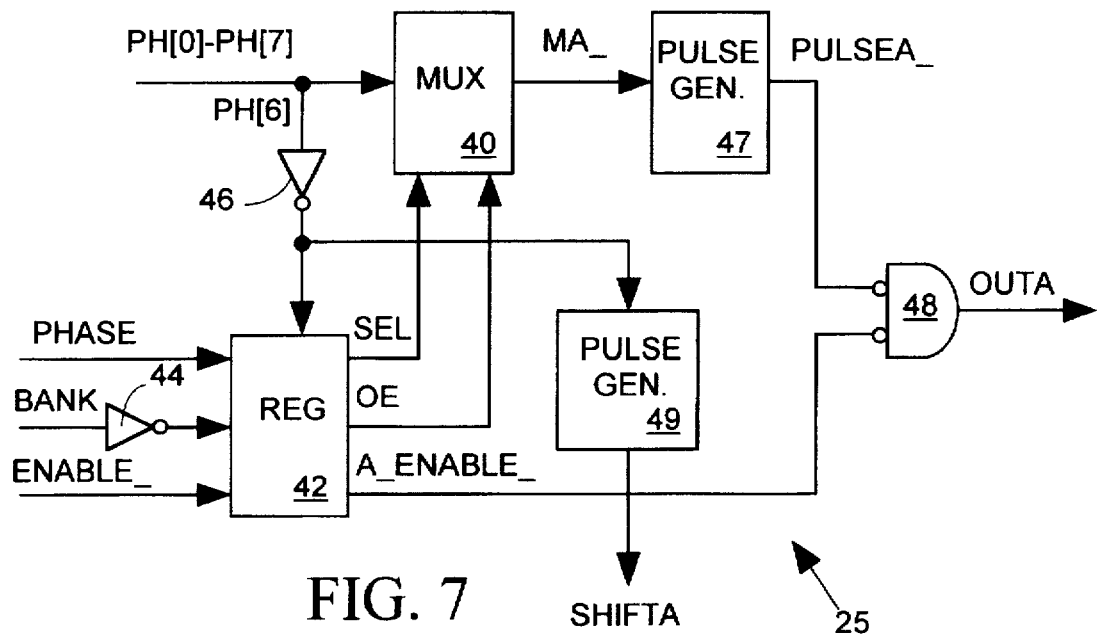
FIG. 7 illustrates in block diagram form details of the bank A selector circuit of FIG. 4.

FIG. 7 illustrates bank A selector 25 of FIG. 4 in more detailed block diagram form. Selector 25 includes a multiplexer 40 receiving the phase signals PH[0]–PH[7] and producing an output signal MA_ tracking a selected one of its input phase signals. A register 42 receives the ENABLE_ bit and the PHASE and BANK portions of the FRACT_O data, the BANK bit having been first inverted by an inverter 44. The PH[6] input phase signal is inverted by an inverter 46 to drive a clock input of register 42. When the PH[6] signal transitions from high to low, the inverter 46 output will transition from low to high, causing register 42 to store its input data. The output of inverter 46 also provides an input to a pulse generator 49. Pulse generator 49 responds to a low to high transition on its input by driving its SHIFTA output high, then after a short time determined by delays within pulse generator 49, the pulse generator will drive its SHIFTA output low again. Pulse generator 49 provides its SHIFTA output to gate 30 of FIG. 4.

The sampled PHASE data stored in register 42 controls the selection made by multiplexer 40. The inverted BANK bit stored in register 42 controls an output enable terminal of multiplexer 40. When the stored BANK bit is true, multiplexer 40 is enabled and MA__ is controlled by the selected one of phases signals PH[0]-PH[7]. When the stored BANK bit is true, multiplexer 40 is enabled and its output signal MA__ is controlled by the selected one of the phase signals PH[0]-PH[7]. When the BANK bit in register 42 is false, multiplexer 40 holds MA__ high. The MA__ output from multiplexer 40 is provided to a pulse generator 47. Pulse generator 47 responds to a high to low transition on its input by driving its PULSEA__ output low, then after a short time determined by delays within pulse generator 47 it will drive its PULSEA__ output high again. The ENABLE__ bit stored in register 42 and the PULSEA__ output signal of pulse generator 47 are supplied to inputs of a NOR gate 48 which produces the OUTA signal. If both the ENABLE__ and PULSEA__ signals are low, gate 48 drives OUTA high, otherwise gate 48 holds OUTA low.

There is a delay between the falling edge of the PH[6] signal (which via inverter 46 clocks register 42) and the time when multiplexer 40 actually responds to a resulting change in the data stored in register 42 by selecting a new phase signal to control its output. This time delay results from the sum of the inherent switching delays of inverter 46, register 42 and multiplexer 40. We chose the falling edge of PH[6] to clock register 42 and adjusted the inherent delay of inverter 46 so that multiplexer 40 switches at a time well before all of its input signals PH[0]-PH[7] transition from high to low. PH[6] was also selected to ensure that adequate hold time is achieved after the PH[0]-PH[7] high-to-low transitions. (See time TSA1 of FIG. 6). This ensures that an OUTA pulse will only be made when the selected phase, one of PH[0]-PH[7] phase signals, transitions from a high state to a low state. After register 42 stores its input data, the stored data controls the operation of multiplexer 40 for one full CLOCK signal cycle. We could choose a phase signal other than PH[6] to clock register 42, but we would have to adjust the inherent delay of inverter 46 and the delay time of register 42 to ensure multiplexer 40 switches at the right time.

Figure 8:
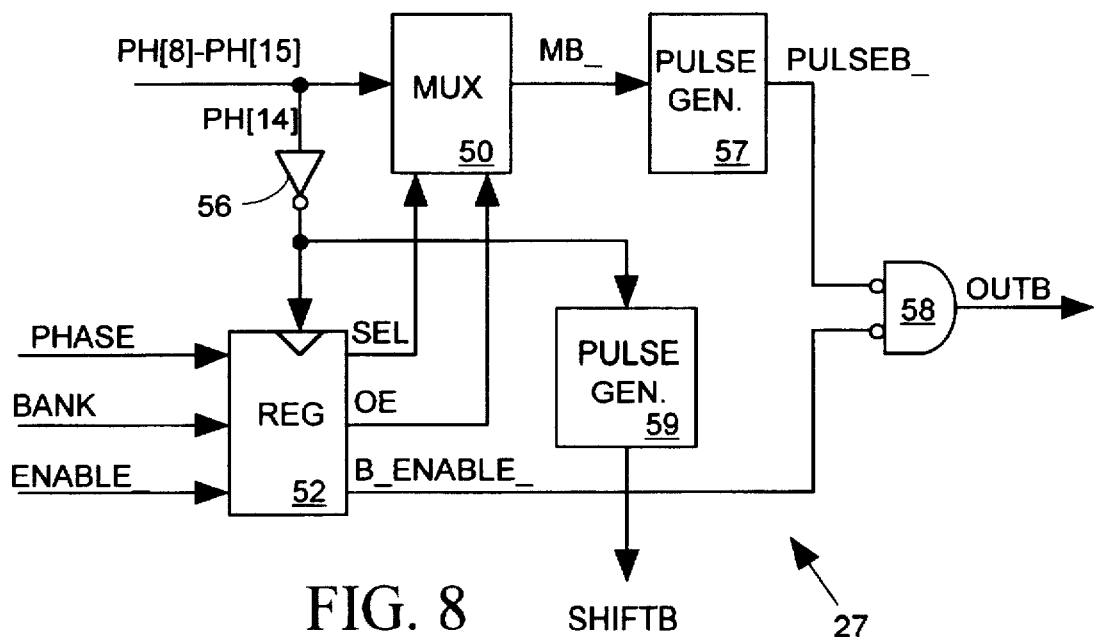
FIG. 8 illustrates in block diagram form details of the bank B selector circuit of FIG. 4.

FIG. 8 illustrates bank B selector 27 of FIG. 4 in more detailed block diagram form. Selector 27 includes a multiplexer 50 receiving the phase signals PH[8]-PH[15] and producing an output signal MB__ tracking a selected one of its input phase signals. A register 52 receives the ENABLE__ bit, and the PHASE and BANK portions of the FRACT_O data. The PH[14] input phase signal is inverted by inverter 56. When the PH[14] signal transitions from high to low, the inverter 56 output transitions from low to high, causing register 52 to store its input data. The output of inverter 56 also provides an input to pulse generator 59. Pulse generator 59 will respond to a low to high transition on its input by driving its SHIFTB output high. Then after a short time determined by internal delays, pulse generator 59 will drive its SHIFTB output low again. Pulse generator 59 provides its SHIFTB output to gate 31 of FIG. 4. The sampled PHASE data stored in register 52 controls the selection made by multiplexer 50. The BANK bit stored in register 52 is supplied to an output enable terminal of multiplexer 50. When the stored BANK bit is true, multiplexer 50 is enabled and MB__ is controlled by the selected one of phases signals PH[8]-PH[15]. When the BANK bit in register 52 is false, multiplexer 50 holds MB__ high. The MB__ output from multiplexer 50 is provided to a pulse generator 57. Pulse generator 57 responds to a high to low transition on its input by driving its PULSEB__ output low. Then after a short time determined by internal delays, pulse generator 57 drives its PULSEB__ output high again. The ENABLE__ bit stored in register 52 and the PULSEB__ output signal of pulse generator 57 are supplied to inputs of a NOR gate 58 which produces the OUTB signal. If both the ENABLE__ and PULSEB__ signals are low, gate 58 drives OUTB high, otherwise gate 58 holds OUTB low. The PH[14] signal is used to initiate the changes to the select lines of multiplexer 50. "This signal is chosen such that multiplexer 50 switches at a time well before all of its input signals PH[8]-PH[15] transition from high to low. PH[14] was also selected to ensure that adequate hold time is achieved after the PH[8]-PH[15] high to low transitions." (See time TSB of FIG. 6.) This ensures that an OUTB pulse will only be made when the selected one of the PH[8]-PH[15] phase signals transitions from a high state to a low state.

Note that bank A selector 25 of FIGS. 4 and 7 inverts the BANK bit of the FRACT_O data before supplying it to register 42, while selector 17 of FIGS. 4 and 8 does not invert the BANK bit before supplying it to register 52. Thus, although the input PHASE, BANK and ENABLE__ data are sampled and stored by both selectors 25 and 27, only one of the selectors 25 or 27 is enabled by the sampled BANK bit of each PHASE and BANK data set. Thus only one of selectors 25 or 27 produces an output pulse in response to each set of input PHASE and BANK data.

When enabled by the BANK and ENABLE__ bits, the bank A selector 25 of FIG. 4 can create a TIMING__ signal pulse once during a period equal to one full CLOCK cycle based on the data last stored in register 42 of FIG. 7 in response to the PH[6] signal pulse. Similarly, bank B selector 27 of FIG. 4 can create a TIMING__ signal pulse once during a period equal to one full CLOCK cycle based on the data last stored in register 52 of FIG. 8 in response to the PH[14] signal pulse. Note that the PH[6] and PH[14] signals of FIGS. 7 and 8 which initiate data acquisition by registers 42 and 52 differ in phase by 180 degrees. Although registers 42 and 52 each sample the input FRACT_O and ENABLE__ data once each cycle of the CLOCK signal, they do so in an alternating fashion. Thus, for example, when selector 25 initiates a SHIFT signal request for new FRACT_O data after acquiring the old FRACT_O data, the other selector 27 does not sample the new FRACT_O data until one half CLOCK cycle later. Therefore the FIFO buffer 13 has one half cycle of the CLOCK signal to deliver new FRACT_O data to the timing vernier and counter bank 14 has one half cycle of the CLOCK signal to transfer control of the ENABLE__ signal from one counter's TC output to the next counter's TC output without affecting recycle time.

Figure 9:
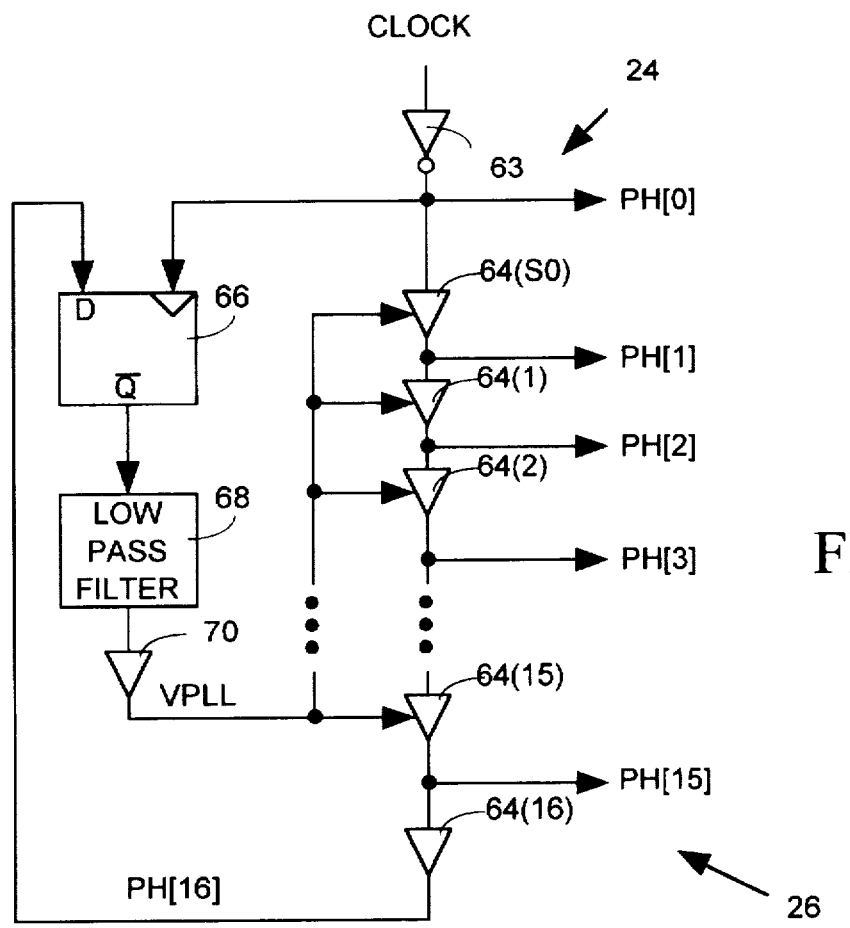
FIG. 9 illustrates in block diagram form details of the delay circuit and phase lock controller of FIG. 4.
Figure 10:
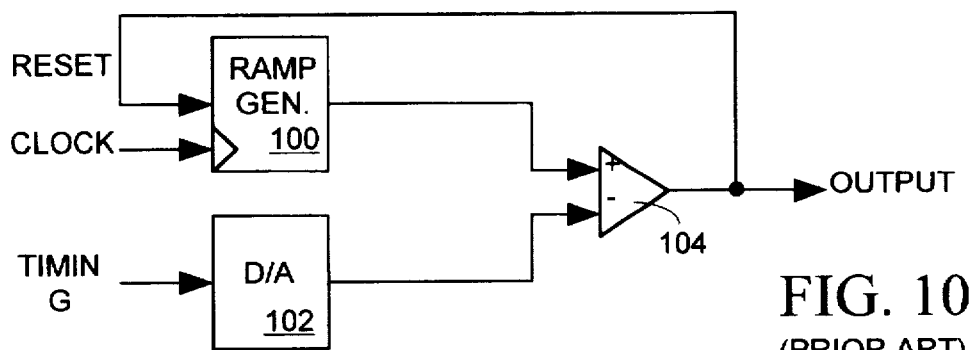
FIG. 10 illustrates in block diagram form a prior art timing signal generator.
Figure 11:
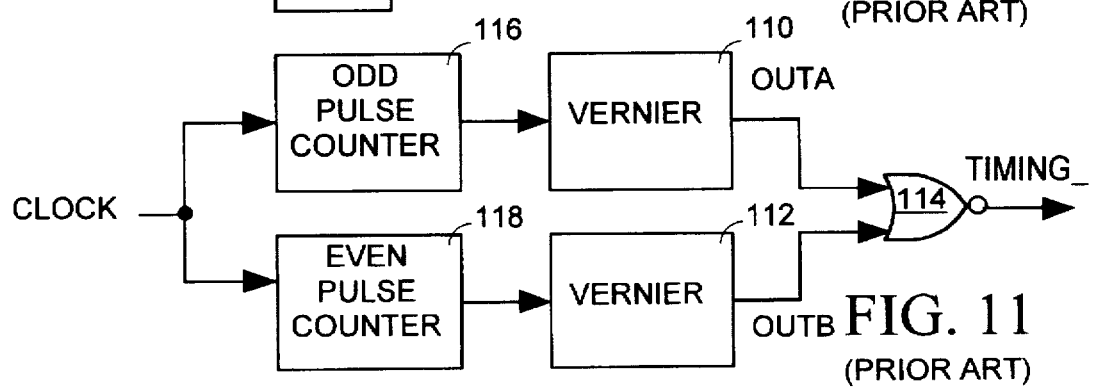
FIG. 11 illustrates in block diagram form a prior art dual timing vernier.

FIG. 9 illustrates delay circuit 24 and phase lock controller 26 of FIG. 4 in more detail. Delay circuit 24 consists of a set of 17 identical buffers 64[0]-64[16] connected in series. The CLOCK signal drives an inverter 63 whose output will feed the series of buffers 64 by driving the input of the first buffer 64[0]. A CLOCK signal pulse thus propagates through each buffer 64 of the series thereby producing phase distributed tap signals PH[0]-PH[16] at corresponding buffer outputs. Tap signals PH[0]-PH[15] are sent to bank A selector 25 and bank B selector 27 of FIG. 4. Tap signal PH[16] is sent to phase lock controller 26 of FIG. 4. Phase lock controller 26 includes a type D flip-flop 66 clocked by the PH[0] signal and receiving tap signal PH[16] at its D input. A low pass filter 68 filters the /Q output of flip-flop 66 and uses the result to drive an amplifier 70 which produces the VPLL signal. The VPLL signal controls the available switching current of buffers 64. The magnitude of VPLL thereby controls the switching speed of buffers 64, and thus controls their signal delays. If tap signal PH[16] lags (or leads) PH[0], the magnitude of VPLL increases (or decreases), thereby increasing (or decreasing) the switching speed of buffers 64 to bring PH[16] in phase with PH[0]. Tap signals PH[0]–PH[15] are thus evenly distributed in phase with leading or trailing edges dividing the CLOCK signal period into 16 equal segments. While the forgoing specification has described a preferred embodiment of the present invention, one skilled in the art may make many modifications to the preferred embodiment without departing from the invention in its broader aspects. For example, it should be understood that the resolution of timing signal generator 10 can also be improved by increasing the number of phase signals PH[0]–PH[15] so that the CLOCK signal is more finely divided. For example, timing resolution can be doubled by doubling the number of tap signals provided by delay circuit 24 from 16 to 32. At the same time, multiplexers 40 and 50 should be resized from 8/1 to 16/1, the three PHASE select bits should be increased to 4 to control the larger multiplexers, and the capacity of registers 42 and 52 of FIGS. 7 and 8 should be increased to accommodate an additional PHASE bit. One might also replace delay circuit 24 of FIG. 9 with a voltage controlled right oscillator or other device for producing a suitable set of phase distributed output signals. The number of selectors may also be increased. The appended claims are therefore intended to cover all such modifications as fall within the true scope and spirit of the invention.

What is claimed is:

1. An apparatus, responsive to a clock signal that is periodic for separately timing each successive pulse of an output timing signal in accordance with input data, the apparatus comprising:

means for receiving the clock signal and generating a plurality of first Periodic Dhase signals and a Plurality of second sets of periodic phase signals frequency locked to the clock signal but distributed in phase;

first selector means for receiving the input data and said first periodic phase signals, for sampling the input data to produce first sampled input data during each period of said clock signal and for generating a first output signal wherein said first sampled input data causes said first selector means to initiate an output pulse in said first output signal in response to a change of state in one of said first periodic phase signals;

second selector means for receiving the input data and said second periodic phase signals, for sampling the input data to produce second sampled input data during each period of said clock signal, and for generating a second output signal, wherein said second sampled input data causes said second selector means to initiate an output pulse in said second output signal in response to a change of state in one of said second periodic phase signals; and means for combining said first and second output signals to produce said output timing signal.

2. The apparatus in accordance with claim 1 wherein said first and second selector means sample the input data at substantially differing times during each period of said clock signal.

3. The apparatus in accordance with claim 1 wherein said first selector means samples said input data at a first time during each period of said clock signal before all of said first periodic phase signals undergo said change of state and wherein said second selector means samples said input data at a second time during each period of said clock signal before all of said second periodic phase signals undergo said change of state.

4. An apparatus for generating an output TIMING signal pulse following a selected change of state of CLOCK signal that is periodic with a delay determined by input BANK data and PHASE data, the CLOCK signal change of state being selected by an input ENABLE signal, the apparatus comprising:

phase signal generator means for receiving the CLOCK signal and generating 2N periodic phase signals PH[0] through PH[2N–1], where N is an integer, each of said phase signals being frequency locked to the CLOCK signal, the phase signals being successively and evenly distributed in phase;

first selector means for producing an OUTA signal, the first selector means periodically sampling the PHASE data, the BANK data and the ENABLE signal to produce first sampled PHASE data, first sampled BANK data, and a first sampled ENABLE signal, selecting one of said phase signals PH[0]–PH[N–1] in response to the first sampled PHASE data, and pulsing the OUTA signal in response to a change of state in said one of phase signals PH[0]–PH[N–1] in response to the first sampled ENABLE signal when the first sampled BANK data is of a first state;

second selector means for producing an OUTB signal, the second selector means periodically sampling the PHASE data, the BANK data and the ENABLE signal to produce second sampled PHASE data, second sampled BANK data, and a second sampled ENABLE signal, selecting one of said chase signals PH[N]–PH[2N–1] in response to the second sampled PHASE data, and producing an OUTB signal pulse in response to a change of state in said one of phase signals PH[N]–PH[2N–1] in response to the second sampled ENABLE signal when the second sampled BANK data is of a second state; and logic means for combining said OUTA and OUTB signals to produce said TIMING signal.

5. The apparatus in accordance with claim 4 wherein said first selector means samples the PHASE data, the BANK data and the ENABLE signal at a first time during each cycle of said CLOCK signal and said second selector means samples the PHASE data, the BANK data and the ENABLE signal at a second time during each cycle of said CLOCK signal, wherein said first and second times substantially differ.

6. The apparatus in accordance with claim 5 wherein said first and second times are separated by a time substantially equal to one half of a period of said CLOCK signal.

7. The apparatus in accordance with claim 6 wherein each of said phase signals has a 50% duty cycle, wherein the first selector means samples the PHASE data, during a first portion of said period of said CLOCK signal when all of said phase signals PH[O] through PH[N–1] undergo a defined change of state; and wherein the second selector means samples the PHASE data, the BANK data and the ENABLE signal during a second portion of said period of said CLOCK signal when all of said phase signals PH[N] through PH[2N–1] undergo said defined change of state.

8. An apparatus for generating an output TIMING signal with pulses timed in accordance with an input periodic CLOCK signal and an input data sequence indicating when the TIMING signal pulses are to occur relative to pulses of the CLOCK signal, each data value of the input data sequence corresponding to a separate pulse of the TIMING signal and indicating a time delay between a next preceding TIMING signal pulse and the corresponding TIMING signal pulse, each data value including CYCLES, PHASE, and BANK data, the apparatus comprising:

a buffer for storing the input data sequence and producing as output each data value of the sequence in succession in response to a succession of input SHIFT signal pulses;

counter means for receiving the CYCLES data included in each data value output produced by the buffer, counting pulses of the CLOCK signal after receiving each CYCLES data and asserting an output ENABLE signal when the count reaches a number represented by the received CYCLES data;

phase signal generator means for receiving the CLOCK signal and generating 2N periodic phase signals PH[0] through PH[2N−1], where N is an integer, each of said chase signals being frequency locked to the CLOCK signal, the phase signals being successively and evenly distributed in phase over one cycle of the CLOCK signal;

first selector means for producing a first output signal OUTA, the first selector means periodically sampling the PHASE data, the BANK data and the ENABLE signal to produce first sampled PHASE data, first sampled BANK data, and a first sampled ENABLE signal, selecting one of said periodic phase signals PH[0]–PH[N−1] in response to the first sampled PHASE data and pulsing the OUTA signal in response to a change of state in said one of phase signals PH[0]–PH[N−1] in response to the first sampled ENABLE signal when the first sampled BANK data is of a first state;

second selector means for producing a second output signal OUTB, the second selector means periodically sampling the PHASE data, the BANK data and the ENABLE signal to produce second sampled PHASE data, second sampled BANK data, and a second sampled ENABLE signal, selecting one of said periodic phase signals PH[N]–PH[2N−1] and producing an OUTB signal pulse in response to a change of state in said one of phase signals PH[N]–PH[2N−1] in response to the second sampled ENABLE signal when the second sampled BANK data is of a second state; and logic means for combining said OUTA and OUTB signals to produce said TIMING signal.

9. The apparatus in accordance with claim 8 wherein said first selector means samples the PHASE data, the BANK data and the ENABLE signal at a first time during each cycle of said CLOCK signal and said second selector means samples the PHASE data, the BANK data and the ENABLE signal at a second time during each cycle of said CLOCK signal, wherein said first and second times substantially differ.

10. The apparatus in accordance with claim 9 wherein said first and second times are separated by a time substantially equal to one half of a period of said CLOCK signal.

11. The apparatus in accordance with claim 10 wherein each of said phase signals has a 50% duty cycle, wherein the first selector means samples the PHASE data, the BANK data and ENABLE signal during a first portion of a period of said CLOCK signal before all of phase signals PH[O] through PH[N−1] undergo a defined change of state and wherein the second selector means samples the PHASE data, the BANK data and the ENABLE signal during a second portion of said period of said CLOCK signal before all of said phase signals PH[N] through PH[2N−1] undergo said defined change of state.

12. The apparatus in accordance with claim 11 further comprising means for transmitting a SHIFT signal pulse to said buffer whenever the first selector means is to produce an OUTA signal pulse and whenever the second selector means is to produce an OUTB signal pulse.

* * * * *

UNITED STATES PATENT AND TRADEMARK OFFICE
CERTIFICATE OF CORRECTION

PATENT NO. : 5,789,958
DATED : August 4, 1998
INVENTOR(S) : Douglas J. CHAPMAN et al It is certified that error appears in the above-identified patent and that said Letters Patent is hereby corrected as shown below:

Column 13, line 42 (claim 1, line 6), "Periodic" should be deleted and replaced with --periodic--; "Dhase" should be deleted and replaced with --phase--; and "Plurality" should be deleted and replaced with --plurality--.

Column 14, line 36 (claim 4, line 29), "chase" should be deleted and replaced with --phase--.

Column 15, line 22 (claim 8, line 24), "chase" should be deleted and replaced with --phase--.

Signed and Sealed this

Twenty-fourth Day of November, 1998

Attest:

BRUCE LEHMAN

*Attesting Officer*  *Commissioner of Patents and Trademarks*